United States Patent
Zhang et al.

(10) Patent No.: US 11,622,419 B2
(45) Date of Patent: *Apr. 4, 2023

(54) AZIMUTHALLY TUNABLE MULTI-ZONE ELECTROSTATIC CHUCK

(71) Applicant: Applied Materials, Inc., Santa Clara, CA (US)

(72) Inventors: Chunlei Zhang, Santa Clara, CA (US); Phillip Criminale, Livermore, CA (US); Steven E. Babayan, Los Altos, CA (US); David Ullstrom, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 108 days.

This patent is subject to a terminal disclaimer.

(21) Appl. No.: 16/595,801

(22) Filed: Oct. 8, 2019

(65) Prior Publication Data

US 2020/0037399 A1 Jan. 30, 2020

Related U.S. Application Data

(63) Continuation of application No. 14/997,842, filed on Jan. 18, 2015, now Pat. No. 10,440,777.

(Continued)

(51) Int. Cl.
*H05B 3/68* (2006.01)
*H05B 1/02* (2006.01)
(Continued)

(52) U.S. Cl.
CPC ..... *H05B 1/0233* (2013.01); *H01L 21/67103* (2013.01); *H01L 21/67248* (2013.01); *H01L 21/6831* (2013.01); *H01L 22/20* (2013.01)

(58) Field of Classification Search
CPC ......... H01L 21/67103; H01L 21/67109; H01L 21/67248; H01L 21/6831; H01L 22/20; H05B 1/0233
(Continued)

(56) References Cited

U.S. PATENT DOCUMENTS 6,238,936 B1  5/2001  Yu
6,345,211 B1  2/2002  Yu
(Continued)

FOREIGN PATENT DOCUMENTS

CN  1323437 C  6/2007
CN  102308380 A  1/2012
(Continued)

OTHER PUBLICATIONS

Office Action from Korean Patent Application No. 10-2019-7017233 dated Jan. 29, 2021.
(Continued)

*Primary Examiner* — Sang Y Paik
(74) *Attorney, Agent, or Firm* — Patterson + Sheridan, LLP

(57) ABSTRACT

Implementations described herein provide a method for processing a substrate on a substrate support assembly which enables both lateral and azimuthal tuning of the heat transfer between an electrostatic chuck and a substrate. The method includes processing a first substrate using a first temperature profile on a substrate support assembly having primary heaters and spatially tunable heaters. A deviation profile is determined from a result of processing the first substrate. The spatially tunable heaters are controlled in response to the deviation profile to enable discrete lateral and azimuthal tuning of local hot or cold spots on the (Continued)

substrate support assembly in forming a second temperature profile. A second substrate is then processed using the second temperature profile.

17 Claims, 8 Drawing Sheets

Related U.S. Application Data

(60) Provisional application No. 62/165,572, filed on May 22, 2015.

(51) Int. Cl.
    *H01L 21/67* (2006.01)
    *H01L 21/683* (2006.01)
    *H01L 21/66* (2006.01)

(58) Field of Classification Search
    USPC .......................................... 219/443.1–468.2
    See application file for complete search history.

(56) References Cited

U.S. PATENT DOCUMENTS

| | | |
|---|---|---|
| 6,388,253 B1 | 5/2002 | Su |
| 6,486,492 B1 | 11/2002 | Su |
| 6,625,497 B2 | 9/2003 | Fairbairn et al. |
| 6,641,746 B2 | 11/2003 | Houge et al. |
| 6,721,616 B1 | 4/2004 | Ryskoski |
| 6,770,852 B1 | 8/2004 | Steger |
| 6,847,014 B1 | 1/2005 | Benjamin et al. |
| 6,858,361 B2 | 2/2005 | Mui et al. |
| 6,895,295 B1 | 5/2005 | Grover et al. |
| 6,921,724 B2 | 7/2005 | Kamp et al. |
| 6,924,088 B2 | 8/2005 | Mui et al. |
| 6,943,053 B2 | 9/2005 | Oluseyi |
| 6,960,416 B2 | 11/2005 | Mui et al. |
| 6,999,848 B2 | 2/2006 | Helwig |
| 7,020,535 B1 | 3/2006 | Bode et al. |
| 7,067,333 B1 | 6/2006 | Pasadyn et al. |
| 7,094,613 B2 | 8/2006 | Mui et al. |
| RE39,518 E | 3/2007 | Toprac et al. |
| 7,250,309 B2 | 7/2007 | Mak et al. |
| 7,265,382 B2 | 9/2007 | Lymberopoulos et al. |
| 7,306,746 B2 | 12/2007 | Chen et al. |
| 7,328,418 B2 | 2/2008 | Yamashita et al. |
| 7,482,178 B2 | 1/2009 | Mui et al. |
| 7,498,106 B2 | 3/2009 | Mui et al. |
| 7,517,708 B2 | 4/2009 | Deshpande et al. |
| 7,567,700 B2 | 7/2009 | Funk et al. |
| 7,601,240 B2 | 10/2009 | Kagoshima et al. |
| 7,642,102 B2 | 1/2010 | Funk et al. |
| 7,713,758 B2 | 5/2010 | Yamashita et al. |
| 7,801,635 B2 | 9/2010 | Funk et al. |
| 7,838,433 B2 | 11/2010 | Kumar |
| 7,844,357 B2 | 11/2010 | Sakano |
| 7,877,161 B2 | 1/2011 | Tomoyasu et al. |
| 8,158,526 B2 | 4/2012 | Grimbergen |
| 8,232,212 B2 | 7/2012 | Davis et al. |
| 8,236,700 B2 | 8/2012 | Cole et al. |
| 8,257,546 B2 | 9/2012 | Davis et al. |
| 8,394,722 B2 | 3/2013 | Delgadino et al. |
| 8,409,993 B2 | 4/2013 | Ko et al. |
| 8,417,362 B2 | 4/2013 | Shen et al. |
| 8,546,732 B2 | 10/2013 | Singh |
| 8,624,168 B2 | 1/2014 | Gaff et al. |
| 8,637,794 B2 | 1/2014 | Singh et al. |
| 8,642,480 B2 | 2/2014 | Gaff et al. |
| 8,852,964 B2 | 10/2014 | Kimura et al. |
| 8,937,800 B2 | 1/2015 | Lubomirsky et al. |
| 8,963,052 B2 | 2/2015 | Benjamin et al. |
| 9,012,243 B2 | 4/2015 | Kimura et al. |
| 10,440,777 B2 * | 10/2019 | Zhang .................... H01L 22/20 |
| 2002/0132377 A1 | 9/2002 | Conchieri et al. |
| 2003/0015521 A1 * | 1/2003 | Ito .......................... H05B 3/143 |
| | | 219/544 |
| 2003/0071032 A1 * | 4/2003 | Yamaguchi ....... H01L 21/67103 |
| | | 219/462.1 |
| 2003/0074098 A1 | 4/2003 | Cheung et al. |
| 2003/0186545 A1 | 10/2003 | Kamp et al. |
| 2004/0077160 A1 | 4/2004 | Singh |
| 2005/0064714 A1 | 3/2005 | Mui et al. |
| 2008/0156785 A1 * | 7/2008 | Ookura ............. H01L 21/67248 |
| | | 219/162 |
| 2008/0228308 A1 | 9/2008 | Phelps |
| 2010/0193501 A1 | 8/2010 | Zucker et al. |
| 2010/0241250 A1 | 9/2010 | Chen et al. |
| 2013/0098895 A1 | 4/2013 | Swanson et al. |
| 2013/0171746 A1 | 7/2013 | Chang et al. |
| 2014/0045337 A1 | 2/2014 | Singh et al. |
| 2014/0048529 A1 | 2/2014 | Pease |
| 2014/0096909 A1 | 4/2014 | Singh et al. |
| 2014/0220709 A1 | 8/2014 | Kimura et al. |
| 2015/0249016 A1 | 9/2015 | Titus et al. |
| 2020/0090968 A1 | 3/2020 | Van Selow |
| 2020/0091017 A1 | 3/2020 | Musselman |

FOREIGN PATENT DOCUMENTS

| | | |
|---|---|---|
| EP | 1599891 A2 | 11/2005 |
| JP | 2007214562 A | 8/2007 |
| JP | 2007317772 A | 12/2007 |
| JP | 04995419 B2 | 8/2012 |
| JP | 2013508968 A | 3/2013 |
| JP | 2014525663 A | 9/2014 |
| KR | 20050106457 A | 11/2005 |
| KR | 20080085727 | 9/2008 |
| KR | 20120103596 A | 9/2012 |
| KR | 20140086959 A | 7/2014 |
| TW | I358785 B | 2/2012 |
| TW | I424524 B | 1/2014 |

OTHER PUBLICATIONS

Office Action from Japanese Patent No. 2019-141139 dated Oct. 21, 2020.
Adaptive control of wafer temperature in RTP; Jin-Young Choi; Hyun Min Do; Hong Seok Choi; , 2001. Proceedings. ISIE 2001. IEEE International Symposium on Industrial Electronics.
A learning approach of wafer temperature control in a rapid thermal processing system, Jin-Young Choi; Hyun Min Do, IEEE Transactions on Semiconductor Manufacturing, vol. 14, No. 1, Feb. 2001; DOI: 10.1109/66.909649 pp. 1-10.
Direct wafer temperature measurements for etch chamber diagnostics and process control, Mei Sun; Calvin Gabriel; , Advanced Semiconductor Manufacturing 2002 IEEE/SEMI Conference and Workshop, DOI: 0.1109/ASMC.2002.1001589, Publication Year: 2002 , pp. 134-139.
Wafer Temperature Measurement and Control During Laser Spike Annealing, Shaoyin Chen; Hebb, J.; Jain, A.; Shetty, S.; Yun Wang, Advanced Thermal Processing of Semiconductors, 2007. RTP 2007. 15th International Conference on Advanced Thermal Processing of Semiconductors, DOI: 10.1109/RTP.2007.4383848, Publication Year: 2007, pp. 239-244.
International Search Report and Written Opinion for PCT/US2016/013156 dated Apr. 26, 2016 (10 pgs.).
Office Action from Japanese Patent No. 2017-554579 dated Jul. 10, 2018.
Office Action from Korean Patent Application No. 10-2017-7034310 dated Jun. 25, 2018.
Final Office Action from Korean Patent Application No. 10-2017-7034310 dated May 15, 2019, with translation.
Decision to Dismiss an Amendment from Korean Patent Application No. 10-2017-7034310 dated May 15, 2019, with translation.
Office Action from Taiwan Patent No. 108135905 dated Oct. 20, 2020.
Office Action from Chinese Patent No. 201680023970.0 dated Nov. 20, 2020.

(56) References Cited

OTHER PUBLICATIONS

Office Action from Korean Patent Application No. 10-2019-7017233 dated Jul. 8, 2021.
Office Action from Japanese Patent No. 2019-141139 dated Oct. 14, 2021.
Appeal Decision for Japanese Patent No. 2019-141139 dated Nov. 4, 2022.

* cited by examiner

AZIMUTHALLY TUNABLE MULTI-ZONE ELECTROSTATIC CHUCK

CROSS-REFERENCE TO RELATED APPLICATIONS

This application is a continuation application of U.S. patent application Ser. No. 14/997,842, now U.S. Pat. No. 10,440,777 B2, filed on Jan. 18, 2016, which claims the benefit of U.S. Provisional Application Ser. No. 61/165,572 filed May 22, 2015, both of which are incorporated herein by reference in their entirety.

BACKGROUND

Field

Implementations described herein generally relate to semiconductor manufacturing and more particularly to real-time temperature control of an electrostatic chuck and method of using the same.

Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

In processes utilizing an electrostatic chuck, uniformity of temperature control across the surface of the substrate is even more challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. Since the structure of the electrostatic chuck can vary both laterally and azimuthally, uniformity of heat transfer between the chuck and substrate is complicated and very difficult to obtain, resulting in local hot and cold spots across the chuck surface, which consequently result in non-uniformity of processing results along the surface of the substrate.

The lateral and azimuthal uniformity of heat transfer between the chuck and substrate is further complicated by heat transfer schemes commonly utilized in conventional cooling plates to which the electrostatic chuck is mounted to form a substrate support assembly. For example, conventional cooling plates typically have only edge to center temperature control. Additionally, during production runtime, the temperature profile of the cooling plates may vary from substrate to substrate as substrates are moved into and out of the processing chamber. Thus, local hot and cold spots within the electrostatic chuck are difficult to control while utilizing the heat transfer features of conventional substrate supports over the production runtime.

Thus, there is a need for an improved substrate support assembly.

SUMMARY

Implementations described herein provide a method for processing a substrate on a substrate support assembly which enables both lateral and azimuthal tuning of the heat transfer between an electrostatic chuck and a substrate. The method includes processing a first substrate using a first temperature profile on a substrate support assembly having primary heaters and spatially tunable heaters. A deviation profile is determined from a result of processing the first substrate. The spatially tunable heaters are controlled in response to the deviation profile to enable discrete lateral and azimuthal tuning of local hot or cold spots on the substrate support assembly in forming a second temperature profile. A second substrate is then processed using the second temperature profile.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Figure 1:
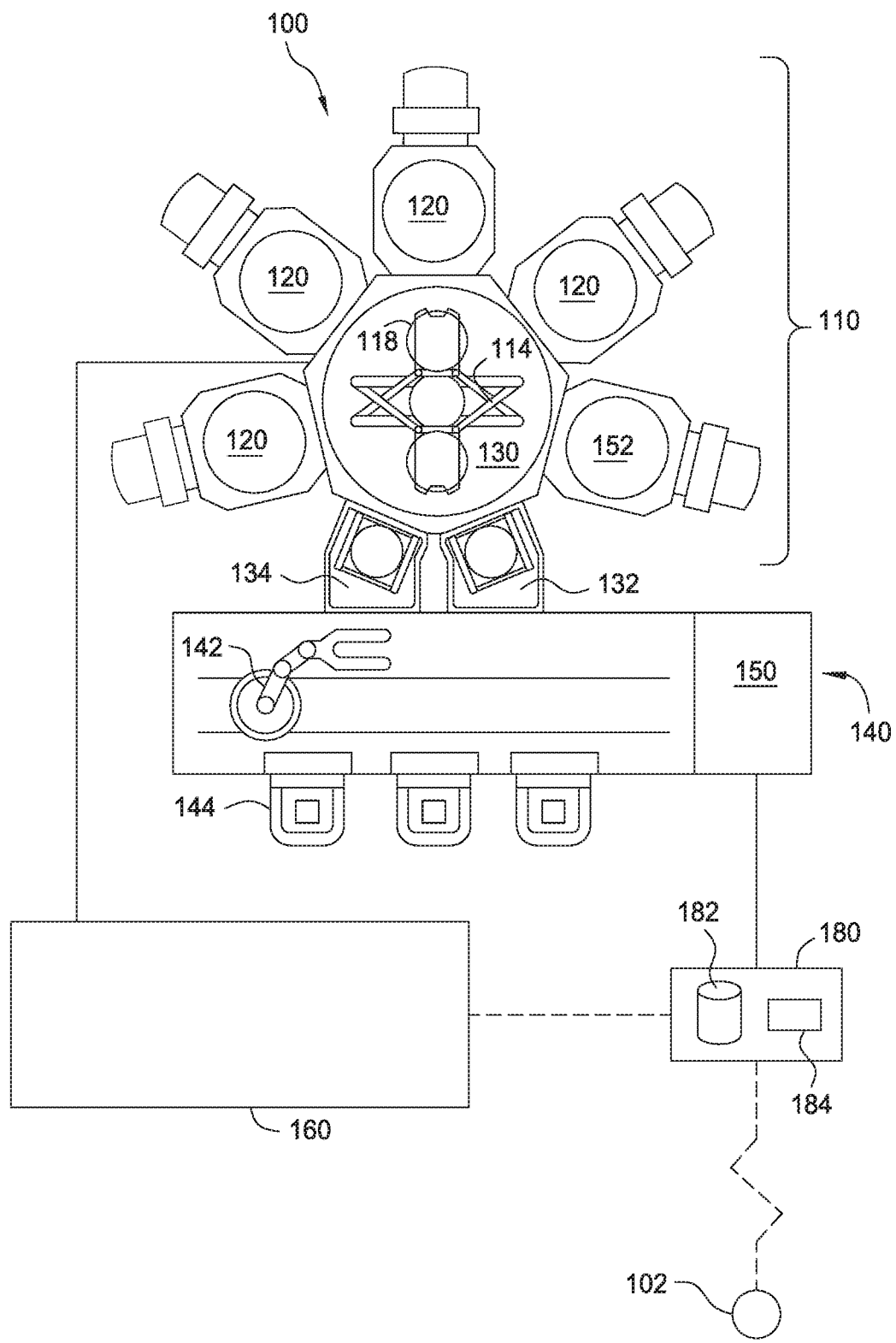
FIG. 1 is schematic top view of a multi-chamber vacuum processing system having at least one processing chamber.

Implementations described herein provide a method for controlling spatially tunable heaters which enables discrete lateral and azimuthal tuning of the temperature profile of a substrate support assembly, which in turn, allows both lateral and azimuthal tuning of the lateral temperature profile of a substrate processed on the substrate support assembly. Moreover, the method enables local hot or cold spots on the substrate to be substantially eliminated.

Although the substrate support assembly having the spatially tunable heaters is described below in an etch processing chamber, the substrate support assembly may be utilized in other types of plasma processing chambers, such as physical vapor deposition chambers, chemical vapor deposition chambers, ion implantation chambers, among others, and other systems where azimuthal tuning of a lateral temperature profile is desirable. It is also contemplated that the spatially tunable heaters may also be utilized to control the temperature of other surfaces, including those not used for semiconductor processing.

In one or more embodiments, the method for controlling the temperature profile of the substrate support assembly allows for the correction of critical dimension (CD) variation at the edge of the substrate during vacuum process, such as etching, deposition, implantation and the like, by allowing the substrate temperature to be utilized to compensate for chamber non-uniformities, such as temperature, flow conductance, electrical fields, plasma density and the like.

As will be appreciated by one of ordinary skill in the art, aspects of the present invention may be embodied as a system, method or computer program product. Accordingly, implementations of the present disclosure may take the form of an entirely hardware embodiment, an entirely software embodiment (including firmware, resident software, microcode, etc.) or an embodiment combining software and hardware aspects that may be referred to herein as a "circuit," "module" or "system." Furthermore, implementations of the present disclosure may take the form of a computer program product embodied in one or more computer readable medium(s) having computer readable program code embodied thereon.

Any combination of one or more computer readable medium(s) may be utilized for storing a program product which, when executed, is configured to perform method for scheduling a preventative maintenance event. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA™ SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the disclosure may be provided to end users through a cloud computing infrastructure. Cloud computing refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g., an amount of storage space consumed by a user or a number of virtualized systems instantiated by the user). A user can access any of the resources that reside in the cloud at any time, and from anywhere across the Internet. In context of the present invention, a user may access software routines (e.g., a method for detecting the breakage of one or more of the grounding straps) or related data available in the cloud. For example, the software routines could execute on a computing system in the cloud. In such a case, the software routines could maintain spatial and non-spatial data at a storage location in the cloud. Doing so allows a user to access this information from any computing system attached to a network connected to the cloud (e.g., the Internet).

FIG. 1 is schematic top view of a multi-chamber vacuum processing system 100 having at least one processing chamber 120. The multi-chamber vacuum processing system 100 also includes a system controller 160, a vacuum-tight processing platform 110 and a factory interface 140. The multi-chamber vacuum processing system 100 may additionally be attached to an advance process controller (APC) 180. The APC 180 may have a database 182 and a computing platform 184. The APC 180 may optionally be used in addition to the system controller 160 and integrates a plurality of process tools 102 at a manufacturing facility. The APC 180 may tracking operations and store metrics on substrates undergoing fabrication therein.

The factory interface (FI) 140 may have a plurality of front opening universal pods (FOUPs) 144 and at least one FI robot 142. The FI 140 may also have additional stations such as a metrology station 150. The metrology station 150 may be alternately be located adjacent the FOUPs 144. The FI robot 1420 may have rails and a moveable end effector, which may be a blade, plurality of fingers, gripper or other suitable apparatus for transferring a substrate 118 thereon. The FI robot 142 is operable at atmospheric conditions and is configured to have a range of motion sufficient to transfer substrates 118 disposed on the moveable end effector between the FOUPs 144, the metrology station 150 and one or more load lock chambers 134, 132 of the processing system 100. The FOUPs 144 may hold a plurality of substrates 118 for transferring the substrates 118 to and from the multi-chamber vacuum processing system 100. For example, the FOUPs 144 may move the substrates 118 processed on the multi-chamber vacuum processing system 100 to a separate metrology station, chemical polishing station or other apparatus for further processing.

The load lock chambers 134, 132 are disposed between the factory interface 140 and the vacuum-tight processing platform 110 to facilitate substrate 118 transfers between a substantially ambient environment maintained in the factory interface 140 and a vacuum environment maintained in the vacuum-tight processing platform 110. The load lock chambers 134, 132 have one or more entry/exit slots (not shown) through which the substrate 118 may transfer into and out of the load lock chambers 134, 132 from the FI 140. Likewise, the load lock chambers 134, 132 have the same number of entry/exit slots through which the substrate 118 may transfer between the interior of the load lock chambers 134, 132 and the vacuum-tight processing platform 110. Each of the entry/exit slots of the load lock chambers 134, 132 is selectively sealed by a slit valve (not shown) to isolate the interior of the load lock chambers 134, 132 from the interiors of either the FI 140 or the vacuum-tight processing platform 110.

The vacuum-tight processing platform 110 has a plurality of attached chambers 120 disposed around a transfer chamber 130 in addition to the load lock chambers 134, 132. The transfer chamber 130 is coupled to a vacuum system (not shown) for providing a reduced atmosphere condition in the vacuum-tight processing platform 110. The transfer chamber 130 houses at least one transfer chamber robot 114. The transfer chamber robot 114 can rotate to transfer the substrate 118 with any of the chambers 120. One or more of the attached chambers 120 may include etch chambers or deposition chambers such as chemical vapor deposition chambers, physical vapor deposition chambers, or atomic layer deposition chambers, having a substrate support assembly 200 (shown in FIG. 2) for processing a substrate 118 thereon. Additionally, one of the attached chambers 120 may be a metrology chamber 152 having metrology equipment for measuring an attribute of the substrate 118, an orientation chamber, de-gas chamber or other suitable chamber for processing the substrate 118. In some embodiments, one chamber 120 may both etch and measure the substrate 118. For instance, metrology equipment for measuring an attribute of the substrate 118 may be incorporated into the chamber 120. Alternatively, metrology equipment for measuring an attribute of the substrate 118 may be located with the transfer chamber 130, the FI 140 or other convenience location.

The system controller 160 is coupled to and controls each chamber 120 and/or module(s) of the multi-chamber vacuum processing system 100. Generally, the system controller 160 may control all aspects of operation of the processing system 100 using direct control of chambers and apparatus of the processing system 100 or, alternatively, by controlling the computers associated with these chambers and apparatus. Furthermore, the system controller 160 may also be configured to communicate with a control unit associated with the transfer chamber robot 114 and other controllers through the APC 180. For example, movements of the transfer chamber robot 114, transferring the substrate 118 to and from the processing chambers 120 and performing process sequences, coordinating operations of the various components of the multi-chamber vacuum processing system 100, and so on, may be controlled by the system controller 160. Additionally, the system controller 160 may control the process recipes in the processing chamber 120. For example, the system controller may control the vacuum, chamber temperature, substrate support surface temperature profile, gas flow rate and various other processing parameters of the process recipe. In operation, the system controller 160 enables feedback from the respective chambers and apparatus to optimize substrate throughput.

The system controller 160 is discussed below with respect to FIG. 4. The system controller 160 may alter the process recipe for the substrate 118 undergoing processing in the chamber 120. The system controller 160 may use feedback from the metrology equipment to determine changes in the processing recipe. The metrology equipment may measure critical dimensions across the substrate 118 and alter process parameters, such as localized temperatures across the substrate support assembly, to change localized processing.

Figure 2:
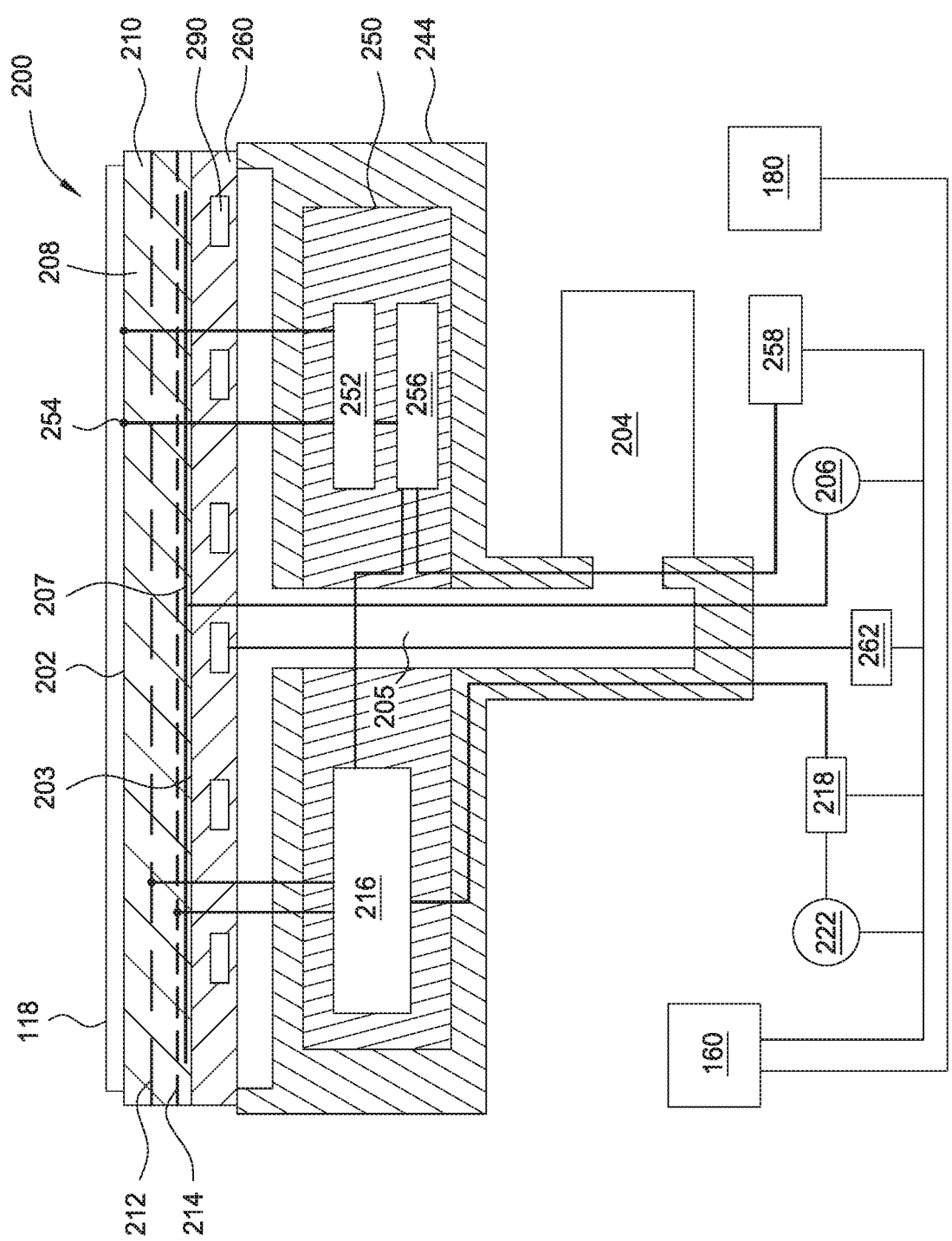
FIG. 2 is a partial cross-sectional schematic side view detailing portions of a substrate support assembly having spatially tunable heaters.

FIG. 2 is a partial cross-sectional schematic side view detailing portions of a substrate support assembly 200 configured to provide azimuthal tuning of the temperature profile across the substrate support assembly. The azimuthal tuning of the temperature profile across the substrate support assembly 200 may be controlled by software routines running on the controller 160. The software routines may also or alternately be stored and/or executed by a second controller (not shown) that is located remotely from the multi-chamber vacuum processing system 100, such as at the processing chamber 120 or the APC 180.

The substrate support assembly 200 generally includes at least a substrate support 210. The substrate support 210 may be a vacuum chuck, an electrostatic chuck, a susceptor, or other work-piece support surface. In one embodiment, the substrate support 210 is an electrostatic chuck and will be described hereinafter as the electrostatic chuck 210. The substrate support assembly 200 may also include a cooling base 260. The cooling base 260 may alternately be separate from the substrate support assembly 200. The substrate support assembly 200 may be removably coupled to a support pedestal 205. The support pedestal 205, which may include a pedestal base 244. The substrate support assembly 200 may be periodically removed from the support pedestal 205 to allow for refurbishment of one or more components of the substrate support assembly 200.

The electrostatic chuck 210 has a mounting surface 203 and a work-piece support surface 202 opposite the mounting surface 203 where the substrate 118 is removably disposed upon the work-piece support surface 202. The electrostatic chuck 210 generally includes a chucking electrode 207 embedded in a dielectric body 208. Although the chucking electrode 207 is shown proximate the mounting surface 203 of the electrostatic chuck 210, the chucking electrode 207 may be embedded in other portions of the electrostatic chuck 210, such as just under the work-piece support surface 202. The chucking electrode 207 may be configured as a mono polar or bipolar electrode, or other suitable arrangement. The chucking electrode 207 is coupled through an RF filter 204 to a chucking power source 206 which provides a RF or DC power to electrostatically secure the substrate 118 to the work-piece support surface 202 of the electrostatic chuck 210. The RF filter 204 prevents RF power utilized to form a plasma within the processing chamber 120 from damaging electrical equipment or presenting an electrical hazard outside the chamber.

The dielectric body 208 of the electrostatic chuck 210 may be fabricated from a ceramic material, such as AlN or $Al_2O_3$. Alternately, the dielectric body 208 may be fabricated from a polymer, such as polyimide, polyetheretherketone, polyaryletherketone and the like. Heaters may be embedded within the dielectric body 208. The dielectric body 208 may include one or more main resistive heaters 212 and/or a plurality of spatially tunable heaters 214. The main resistive heaters 212 may be provided to elevate the temperature of the substrate support assembly 200 to a temperature for conducting chamber processes, such as processing the substrate 118 and/or cleaning the interior of the processing chamber 120. The main resistive heater 212 may be configured to provide any one or more laterally separated heating zones, for example, a plurality of concentric ring-shaped zones. The spatially tunable heaters 214 are complimentary to the main resistive heaters 212 and configured to adjust the localized temperature of the electrostatic chuck 210 in a plurality of discrete locations within any one or more of a plurality of laterally separated heating zones defined by the main resistive heaters 212. For example, the spatially tunable heaters 214 may be arranged in a polar array, Cartesian grid of columns and rows, a hexagonal grid, or other suitable matrix. The spatially tunable heaters 214 thus provide localized adjustments to the temperature profile of the substrate 118 placed on the substrate support assembly 200. Thus, the main resistive heaters 212 operate to maintain the temperature profile of the work-piece support surface 202 on a globalized macro scale, while the spatially tunable heaters 214 operate to adjust the temperature at discreet locations of the temperature profile of the work-piece support surface 202 on a localized micro scale.

The main resistive heaters 212 and spatially tunable heaters 214 are coupled through an RF filter 218 to a heater power source 222. The heater power source 222 may provide 900 watts or more power to the heaters 212, 214. The controller 160 may control the operation of the heater power source 222, which is generally set provide power to individual heaters 212, 214 for heating the substrate 118 to a predefined temperature profile. In one embodiment, the main resistive heaters 212 include laterally separated heating zones, wherein the controller 160 enables one zone of the main resistive heaters 212 or even single spatially tunable heaters 214 to be preferentially heated relative to adjacent heaters 212, 214. In some embodiments, each spatially tunable heater 214 may be independently controlled to provide a temperature different than that of another one of the spatially tunable heaters 214. In some embodiments, a plurality, such as at least two and as many as all, of the spatially tunable heaters 214 are independently and simultaneously powered to provide a temperature profiled which is very stable and does not jump in around, which results in a steady and easily controlled temperature profile, which contributes to enhanced uniformity and predictability of substrate processing results.

The electrostatic chuck 210 may include one or more temperature sensors 254. The temperature sensors 254 may measure temperature at a plurality of discrete locations on the work-piece support surface 202. The temperature sensors 254 may provide temperature feedback information to the controller 160 for controlling the power applied by the heater power source 222 to the main resistive heaters 212 and the spatially tunable heaters 214. Additionally, the feedback information may be used to control the operations of the cooling base 260.

The electrostatic chuck 210 may be disposed on the temperature controlled cooling base 260. The temperature controlled cooling base 260 is coupled to a heat transfer fluid source 262. The heat transfer fluid source 262 provides a heat transfer fluid, such as a liquid, gas or combination thereof, which is circulated through one or more conduits 290 disposed in the cooling base 260. The controller 160 may control the fluid flowing through isolated neighboring conduits 290 to enabling local control of the heat transfer between the electrostatic chuck 210 and different regions of the cooling base 260, which assists in controlling the lateral temperature profile of the substrate 118.

The pedestal base 244 is disposed below the cooling base 260 and is configured to accommodate a plurality of driving mechanisms configured to raise and lower a plurality of lifting pins. Additionally, the pedestal base 244 is configured to accommodate the plurality of fluid connections from the electrostatic chuck 210 and the cooling base 260. The pedestal base 244 is also configured to accommodate the plurality of electrical connections from the electrostatic chuck 210. The myriad of connections, for example fluids, electrical, data signals, may run externally or internally of the substrate support assembly 200.

The system controller 160 may include a controller board 250 that may be disposed in the pedestal base 244. Alternately, the controller board 250 may be disposed elsewhere inside or outside the substrate support assembly 200. The controller board 250 may have a pulse width modification (PWM) heater controller 216. The controller board 250 may also have an optical communication interface board 256. The controller board 250 also may optionally have a temperature sensor controller 252.

The temperature sensor controller 252 may be communicatively coupled to the temperature sensors 254 for measuring the substrate 118 temperature. The temperature sensor controller 252 may convert the signals from the temperature sensors 254 to actual temperature readings in discrete locations about the work-piece support surface 202. The controller board 250 also may optionally have a metrology controller (not shown) for determining the thickness of a substrate 118 disposed on the work-piece support surface 202.

The PWM heater controller 216 may connect to the heaters 212, 214. The PWM heater controller 216 may modify the power coming from the heater power source 222 to the individual heaters 212, 214. The PWM heater controller 216 may be programmed and calibrated by measuring the temperature at each spatially tunable heater 214. That is, each spatially tunable heater 214 has its own independent PWM control. The PWM heater controller 216 may control the temperature by adjusting the power parameters for individual spatially tunable heaters 214. For example, 100 percent power to one of the spatially tunable heater 214 may result in about 5 degrees Celsius of heat output for increasing the temperature set by the main heater for the surface location above the spatially tunable heater 214. Additionally, 20 percent power to one or more of the spatially tunable heaters 214 may result in about a 1 degree Celsius heat output for increasing the temperature set by the main heater for the surface location above the spatially tunable heater 214. The power may be reduced to 20% for several of the spatially tunable heater 214 and maintained at that level throughout a processing operation. Additionally, the PWM heater controller 216 may operate one or more spatially tunable heaters 214 at a first power level, for example 80 percent, while simultaneously operating one or more separate spatially tunable heaters 214 at a second power level, for example about 20 percent. In one embodiment, the temperature may be regulated with incremental power increases to the spatially tunable heaters 214. For example, a temperature rise may be obtained with a percentage increase, for example 9% increase, in the power supplied to the spatially tunable heater 214 during the course of a process. In another embodiment, the temperature may be regulated by cycling the spatially tunable heater 214 on and off, while the other tunable heaters 214 also cycled on and off, either in-phase, or out of phase. In yet another embodiment, the temperature may be regulated by a combination of adjusting the power levels, cycling and incrementally adjusting the power to the spatially tunable heater 214 as needed to maintain a desired temperature profile.

A temperature map may be obtained by varying the heat output of each individual spatially tuning heater 214 all at one instance. The map may correlate the CD or substrate temperature profile to the power distribution curve for each spatially tunable heater 214. Thus, the spatially tunable heater 214 may be used to generate a temperature profile on the substrate based on a program regulating power settings for the individual spatially tunable heaters 214. The logic can be placed directly in the PWM heater controller 216 or in an externally connected controller, such as the controller 160. Thus, the PWM heater controller 216 is configured to independently control an output of one of the plurality of spatially tunable heaters 214 relative to another of the plurality of spatially tunable heaters 214 as well as the main resistive heaters 212.

The optical communication interface board 256 may interface with the PWM heater controller 216. The optical communication interface board 256 may also interface with other controllers such as the temperature sensor controller 252. The optical communication interface board 256 may have an optical connection to an optical converter 258. The optical interface board 256 may send an optical signal to the optical converter 258 for communicating with the controller 160. Thus, communication between the PWM heater controller 216 and the controller 160 may be performed by optical signals which are free of damaging RF energy. For example, the controller 160 may send a signal control the heat output from one or more of the spatially tunable heaters 214 for adjusting the temperature profile of the substrate 118 disposed on the electrostatic chuck 210. The signal instruction from the controller 160 may enter the optical converter 258 for transmission to the optical communication interface board 256 before delivery of the instruction to the PWM heater controller 216 for controlling the heating profile of the substrate 118 during processing. A benefit of the optical communication interface board 256 is the ability to prevent RF power from traveling through control circuitry leaving the substrate support assembly 200.

The temperature of the surface for the substrate 118 in the processing chamber 120 may be influenced by the evacuation of the process gasses by the pump, the slit valve door, the plasma and other factors. The controller 160 may have a temperature profile map for the substrate 118 for obtaining high quality processing results. The controller 160 may receive input from the metrology equipment or other processing equipment to correct for deviation or adverse trends in the process results of the substrate 118. For example, one area of the substrate 118 may etch faster than another area of the substrate 118. The controller 160 may signal the spatially tunable heaters 214 to adjust the surface temperature of the substrate 118 in the area deviating in the etch rate. The controller 160 may activate the spatially tunable heaters 214 in a pattern similar in shape to these areas. The spatially tunable heaters 214 improve the temperature profile of the surface of the substrate 118 produced by the main resistive heaters 212 by reducing variations in the temperature profile to about +/−0.3 degrees Celsius. The temperature profile may be made uniform or to vary precisely in a predetermined manner across regions of the substrate 118 through the use of the spatially tunable heaters 214 to obtain desired results. The use of independently controllable spatially tunable heaters 214 to smooth out or correct the temperature profile generated by the main resistive heaters 212 enable control of the local temperature uniformity across the substrate to very small tolerances, thereby enabling precise process and CD control when processing the substrate 118. Additionally, the small size and high density of the spatially tunable heaters 214 relative to the main resistive heaters 212 enables temperature control at specific locations on the substrate support assembly 126, substantially without affecting the temperature of neighboring areas, thereby allowing local hot and cool spots to be compensated for without introducing skewing or other temperature asymmetries.

It is contemplated that there may be about 200 to about 400, or even more spatially tunable heaters 214 in a given embodiment of a substrate support assembly 200 configured for use with a 300 mm substrate. Even more spatially tunable heaters 214 are contemplated for substrates of 450 mm or larger. Exemplary distribution of the spatially tunable heaters 214 are described further below with reference to FIGS. 3A-3D.

Figure 3A:
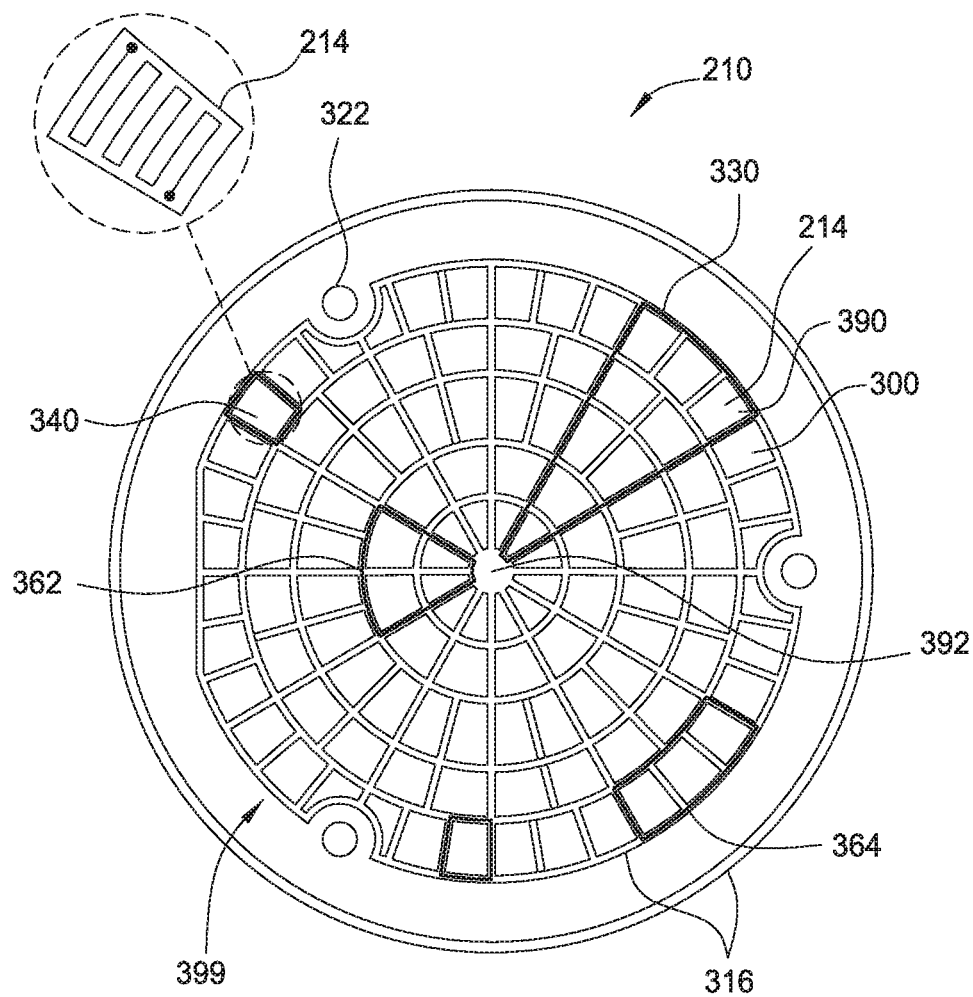
FIGS. 3A-3D are top views of the substrate support assembly illustrating example layouts for the spatially tunable heaters.
Figure 3B:
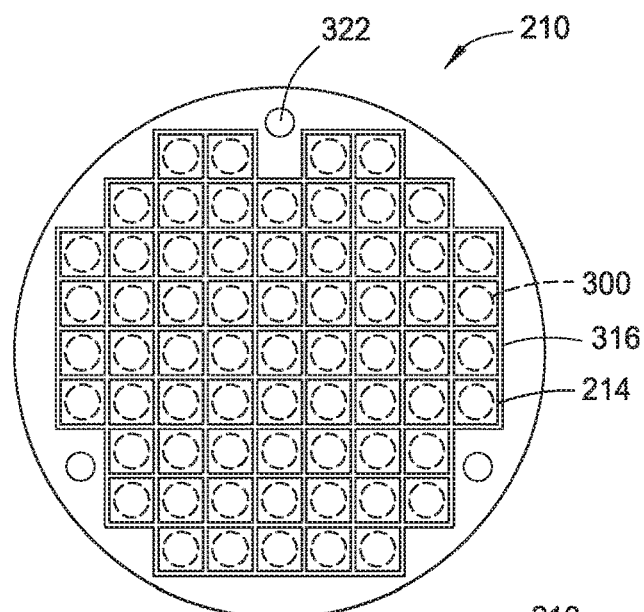
Figure 3C:
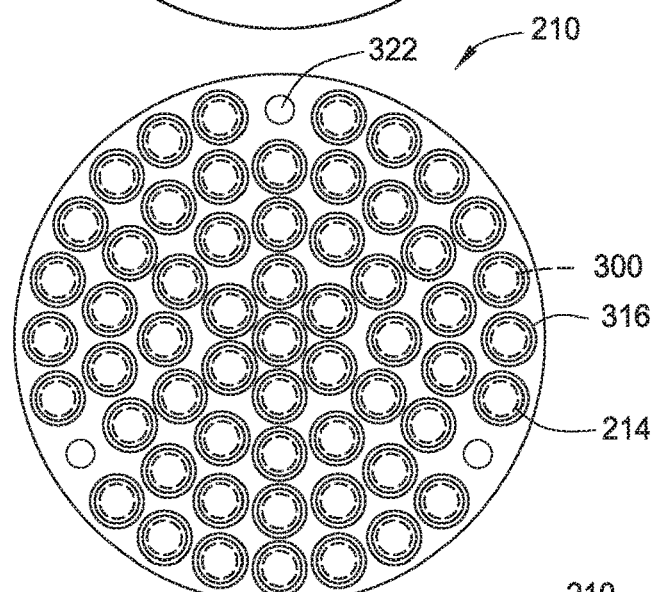
Figure 3D:
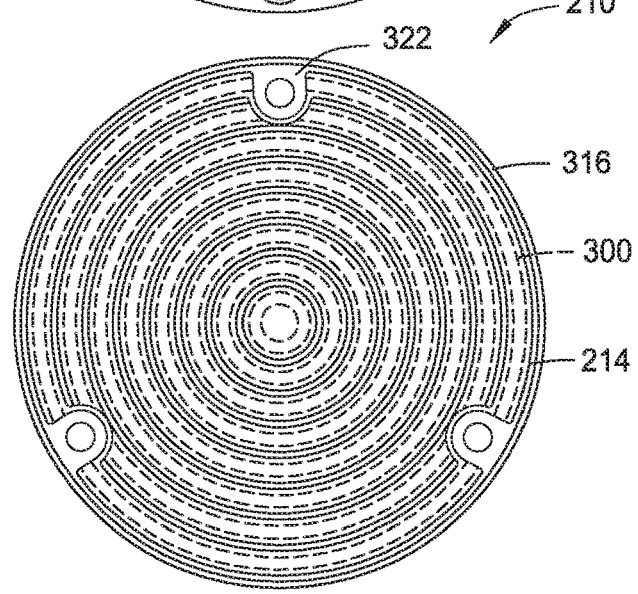

FIGS. 3A-3D are top views of the electrostatic chuck 210 illustrating example layouts of cells 390 having the spatially tunable heaters 214 therein. FIG. 3A is a top view of the electrostatic chuck 210 of FIG. 2, according to one embodiment. FIGS. 3B-3D are top views of the electrostatic chuck 210 of FIG. 2, according to alternate embodiments. The cells 390 may have material (or gaps) which act as a thermal choke 316 between adjacent cells 390. The thermal chokes 316 separate and reduce conduction between adjacent cells 300. Thus, by individually and independently controlling the power provided to each spatially tunable heaters 214 in each cell 390, a localized approach is achieved for controlling the temperature which enables specific points of the substrate 118 to be heated or cooled, thereby enabling a truly addressable lateral temperature profile tuning and control of the surface of the substrate 118.

Referring now to FIG. 3A, the thermal choke 316 is disposed between each neighboring cell 390. Each cell 390 has associated therewith at least one of the spatially tunable heaters 214. The number of cells 390 shown is for illustration only, and any number of embodiments may have substantially more (or less) cells 390. The number of spatially tunable heaters 214 may be at least an order of magnitude greater than the number of main resistive heaters 212. The number of spatially tunable heaters 214 located across the substrate support assembly 200 may easily be in excess of several hundred.

The spatially tunable heaters 214 may be configured in a pattern 399 to efficiently generate a heat profile along the surface of the electrostatic chuck 210. The pattern 399 may be symmetric about a midpoint 392, while providing clearance in and around holes 322 for lift pins or other mechanical, fluid or electrical connections. Each spatially tunable heater 214 may be controlled by the controller 160 through the PWM controller 216. The PWM controller 216 may turn on a single spatially tunable heater 214 defining a local area 340; or a plurality of spatially tunable heaters 214 grouped to define an inner wedge 362, a perimeter group 364, a pie shaped area 330, or other desired geometric configuration, including non-contiguous configurations for determining a desired temperature profile. In this manner, temperature can be precisely controlled at independent locations along the surface of the electrostatic chuck 210, such independent locations not limited to concentric rings, or other center to edge configurations known in the art. Although the pattern 399 shown is comprised of discontinuous smaller units, the pattern 399 may alternatively have larger and/or smaller units, extend to the edge, or have other forms. In the embodiment depicted in FIG. 3A, the pattern 399 of spatially tunable heaters 214 are arranged in a polar array about the midpoint 392, which in some embodiments, may coincide with the centerline of the electrostatic chuck 210.

FIG. 3B is a top view of the electrostatic chuck 210 depicted in FIG. 2, according to another embodiment. The spatially tunable heaters 214 are arranged in the form of a grid, thus defining an array of temperature control cells 390 also arranged in the grid pattern. Although the grid pattern of spatially tunable heaters 214 is shown as an X/Y (Cartesian) grid comprised of rows and columns, the grid pattern of spatially tunable heaters 214 may alternatively have some other uniformly packed form, such as a hexagon close pack. It should be appreciated, as discussed supra, the spatially tunable heaters 214 may be activated in groups or singularly.

FIG. 3C is a top view of the electrostatic chuck 210 depicted in FIG. 2, according to another embodiment. FIG. 3C illustrates a plurality of spatially tunable heaters 214 arranged in a polar array. Optionally, one or more of thermal chokes 316 may be disposed between the spatially tunable heaters 214. The polar array pattern of the spatially tunable heaters 214 defines the neighboring cells 390, which are thus also be arranged in a polar array. Optionally, thermal chokes 316 may be utilized to isolate each cell 390 from the adjacent cell 390.

FIG. 3D is a top view of the electrostatic chuck 210 depicted in FIG. 2, according to another embodiment. FIG. 3D illustrates a plurality of spatially tunable heaters 214 arranged in concentric channels. The concentric channel pattern of the spatially tunable heaters 214 may be optionally separated by thermal chokes 316. It is contemplated that the spatially tunable heaters 214 and cells 390 may be arranged in other orientations.

The number and density of the spatially tunable heaters 214 contribute to the ability for controlling the temperature uniformity across the substrate to very small tolerances which enables precise process and CD control when processing the substrate 118. Additionally, individual control for one of the spatially tunable heaters 214 relative to another spatially tunable heater 214 enables temperature control at discrete locations along the surface of the substrate support assembly 200 without substantially affecting the temperature of neighboring or adjacent areas of the surface. This feature allows local hot and cool spots to be compensated for without introducing skewing or other temperature asymmetries. The spatially tunable heaters 214 may have an individual temperature range between about 0.0 degrees Celsius and about 10.0 degrees Celsius with the ability to control the temperature rise in increments of about 0.1 degrees Celsius. In one embodiment, the plurality of spatially tunable heaters 214 in the substrate support assembly 200 in conjunction with the main resistive heaters 212 have demonstrated the ability to control the temperature uniformity of a substrate 118 processed thereon to less than about ±0.3 degrees Celsius. Thus, the spatially tunable heaters 214 allow both lateral and azimuthal tuning of the lateral temperature profile of the substrate 118 processed on the substrate support assembly 200.

The heaters 214, 212 may be controlled by a software routine. The software may incorporate current substrate CD measurements and process results along with the process recipes and other parameters to tune the temperature profile for the substrate 118 undergoing processing in the process chamber 120.

Figure 4:
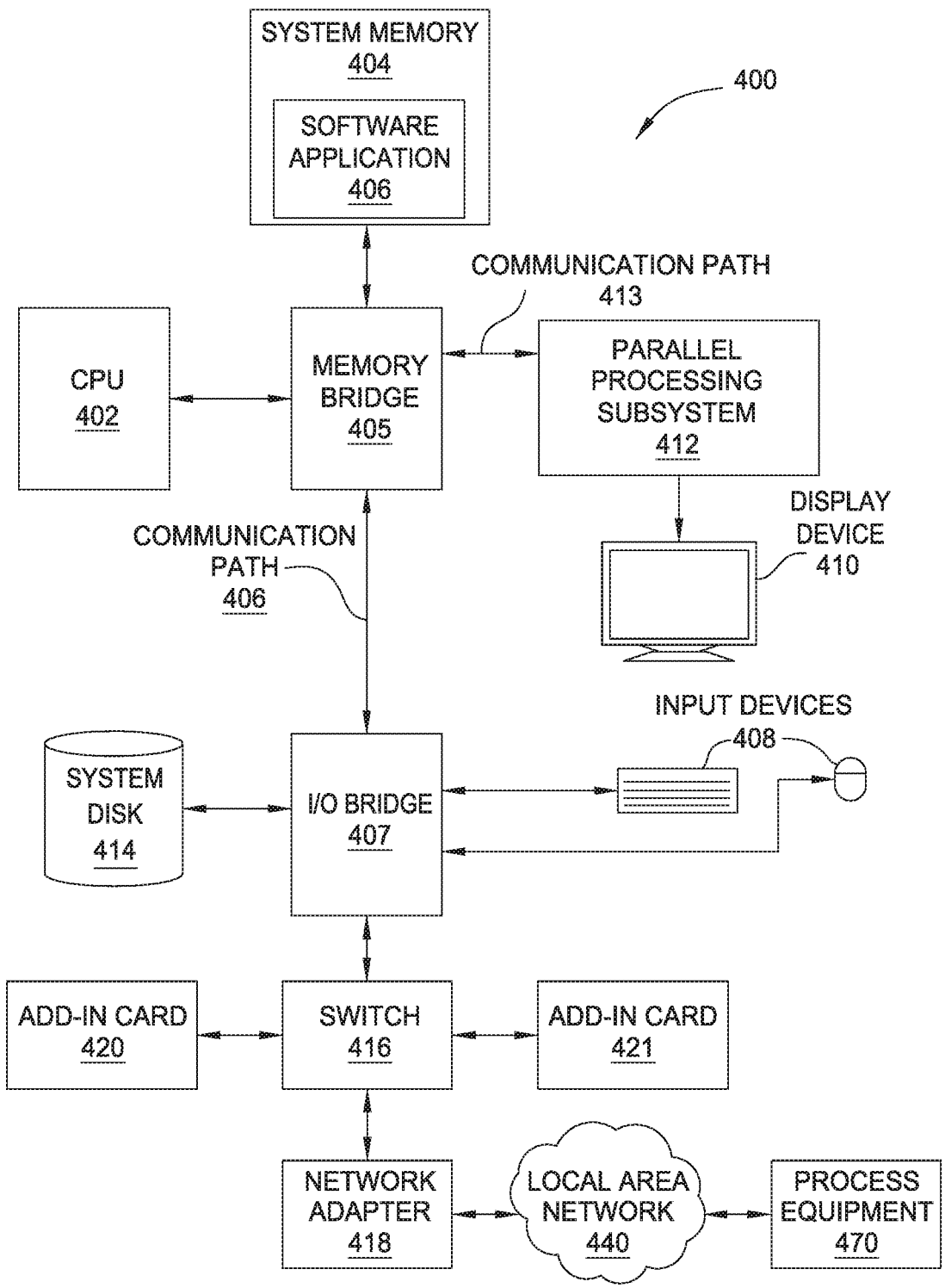
FIG. 4 is a graphical depiction for one architecture of a system suitable for storing and executing software routines in which embodiments of the present invention may be implemented.

Turning to FIG. 4, a graphical depiction is provided for example architecture of a system suitable for storing and executing software routines. The software routines may include embodiments for controlling the temperature in multiple zones and discretely along the substrate surface. This figure in no way limits or is intended to limit the scope of implementing the process controller. The system 400 may be a personal computer, industrial processor, personal digital assistant, mobile phone, mobile device or any other device suitable for practicing one or more embodiments. The controller 160 may have a similar architecture to that of the system 400. The system 400 may run a software routine for controlling the temperature profile of substrates 118 undergoing processing in one or more of the process chambers 120 of the processing system 100. Additionally, or alternately, an secondary or external controller, such as APC 180, may have a similar architecture as system 400 and provide support, such as data or software, for controlling the temperature profile of the substrate 118.

The system 400 includes a central processing unit (CPU) 402 and a system memory 404 communicating via a bus path that may include a memory bridge 405. CPU 402 includes one or more processing cores, and, in operation, CPU 402 is the master processor of the system 400, controlling and coordinating operations of other system components. System memory 404 stores a software application 406, and data, for use by CPU 402. CPU 402 runs software applications and optionally an operating system. Memory bridge 405, which may be, e.g., a Northbridge chip, is connected via a bus or other communication path (e.g., a HyperTransport link) to an I/O (input/output) bridge 407. I/O bridge 407, which may be, e.g., a Southbridge chip, receives user input from one or more user input devices 408 (e.g., keyboard, mouse, joystick, digitizer tablets, touch pads, touch screens, still or video cameras, motion sensors, and/or microphones) and forwards the input to CPU 402 via memory bridge 405.

A display processor 412 is coupled to a memory bridge 405 via a bus or other communication path (e.g., a PCI Express, Accelerated Graphics Port, or HyperTransport link); in one embodiment display processor 412 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 404.

Display processor 412 periodically delivers pixels to a display device 410 (e.g., a screen or conventional CRT, plasma, OLED, SED or LCD based monitor or television). Additionally, display processor 412 may output pixels to film recorders adapted to reproduce computer generated images on photographic film. Display processor 412 can provide display device 410 with an analog or digital signal.

A system disk 414 is also connected to an I/O bridge 407 and may be configured to store content and applications and data, such as a database library 415, for use by CPU 402 and display processor 412. System disk 414 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 416 provides connections between the I/O bridge 407 and other components such as a network adapter 418 and various add-in cards 420 and 421. Network adapter 418 allows the system 400 to communicate with other systems via an electronic communications network, and may include wired or wireless communication over local area networks 440 and wide area networks such as the Internet.

Other components (not shown), including USB or other port connections, film recording devices, and the like, may also be connected to I/O bridge 407. For example, process equipment 470 may operate from instructions and/or data provided by CPU 402, system memory 404, or system disk 414. Communication paths interconnecting the various components in FIG. 4 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

The process equipment 470 may be one or more semiconductor processing chamber, such as the processing chamber 120. In one embodiment, display processor 412 incorporates circuitry optimized for performing mathematical operations, including, for example, math co-processor, and may additionally constitute a graphics processing unit (GPU). In another embodiment, display processor 412 incorporates circuitry optimized for general purpose processing. In yet another embodiment, display processor 412 may be integrated with one or more other system elements, such as the memory bridge 405, CPU 402, and I/O bridge 407 to form a system on chip (SoC). In still further embodiments, display processor 412 is omitted and software executed by CPU 402 performs the functions of display processor 412.

Pixel data can be provided to display processor 412 directly from CPU 402. In some embodiments of the present invention, instructions and/or data representing a predictive analysis is provided to set of server computers, each similar to the system 400, via network adapter 418 or system disk 414. The servers may perform operations on subsets of the data using the provided instructions for analysis. The results from these operations may be stored on computer-readable media in a digital format and optionally returned to the system 400 for further analysis or display. Similarly, data may be output to other systems for display, stored in a database library 415 on the system disk 414, or stored on computer-readable media in a digital format.

Alternatively, CPU 402 provides display processor 412 with data and/or instructions defining the desired output images, from which display processor 412 generates the pixel data of one or more output images, including characterizing and/or adjusting the offset between stereo image pairs. The data and/or instructions defining the desired output images can be stored in system memory 404 or graphics memory within display processor 412.

CPU 402 and/or display processor 412 can employ any mathematical, function or technique known in the art to create one or more results from the provided data and instructions, including predictive analysis relating facility state information to maintenance information to predict the need for maintenance events.

It will be appreciated that the system shown herein is illustrative and that variations and modifications are possible. The connection topology, including the number and arrangement of bridges, may be modified as desired. For instance, in some embodiments, system memory 404 is connected to CPU 402 directly rather than through a bridge, and other devices communicate with the system memory 404 via the memory bridge 405 and the CPU 402. In other alternative topologies display processor 412 is connected to the I/O bridge 407 or directly to CPU 402, rather than to memory bridge 405. In still other embodiments, I/O bridge 407 and memory bridge 405 might be integrated into a single chip. The particular components shown herein are optional; for instance, any number of add-in cards or peripheral devices might be supported. In some embodiments, the process equipment 470 may be connected directly to the I/O bridge 407. In some embodiments, switch 416 is eliminated, and network adapter 418 and add-in cards 420, 421 connect directly to the I/O bridge 407.

Various embodiments of the invention may be implemented as a program product for use with a computer system. The software routines of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Feedback control and feedforward control designs, i.e., software routines, may both be utilized in the method run by the program code for adjusting the temperature profile of a substrate. Metrology data from processing a current substrate is fed back to the controller (either look up tables, PID, MPC or iterative learning controller). Upstream metrology data may also be input to the feedforward controller routine. Either the feedback or feedforward controller routine, or both, can determine a desired offset temperature profile for processing a subsequent substrate. The offset temperature profile is then input to the model based temperature tuner, the results of the tuner will generate the next run recipe parameters inclusive of the determined offsets at discrete locations throughout the temperature profile. Such a process will enable process tuning with the control of electrostatic chuck temperature via adjusting the spatially tunable heaters and cooling components. A model based substrate temperature profile is made possible given the multiple zone temperature controlled electrostatic chuck having large resistive heaters for main tuning, and small size uniform or non-uniform pattern spatially tunable heaters for fine resolution control. For example, the electrostatic chuck may have primary heaters forming four zones and multiple small spatially tunable heaters overlapping the four zones. A substrate temperature model is developed from physical modeling and calibrated with experimentation data. In production, an 14 wafer is used to calibrate the model further due to electrostatic chuck to electrostatic chuck and RF hour variations.

A multi-zone and high resolution temperature control electrostatic chuck for process tuning temperature profile control can be heated or cooled or both. The electrostatic chuck may have a non-uniform pattern for the activating the spatially tunable heaters with each spatially tunable heater having a unique heat output depending on a programmed power output to the spatially tunable heater. The temperature profile may be adjusted for tuning a process for achieving critical dimension (CD) uniformity tuning, incoming CD compensation, etch rate (ER) tuning, etc. The temperature profile control method can be feedback from current metrology data, or feedforward from previous metrology data or upstream process data. The control method does not limit to iterative learning control (which is non-model based). Typical control tuning like PID, LUT (look up table), or advanced model based control can be used.

Multi-zone primary heaters and resolution temperature control achieved by spatially tunable heaters in the ESC can be used to maintain consistent substrate temperatures given differences from one ESC to another ESC as well as RF hour dependency. The multi-zone and resolution temperature control of the ESC can be used to match a temperature profile for a substrate to a model profile under varying chamber conditions. For example, edge zone temperature control can used to minimize process kit erosion or compensate edge process drift to increase mean time between cleaning the chamber. The ability to affect non-uniform shapes for the temperature control profile is designed to correct inherent non-uniformity of chamber hardware. Additionally, the spatially tunable heaters may be used as a probe for temperature or heat flux measurement for developing real-time temperature profiles.

Figure 5:
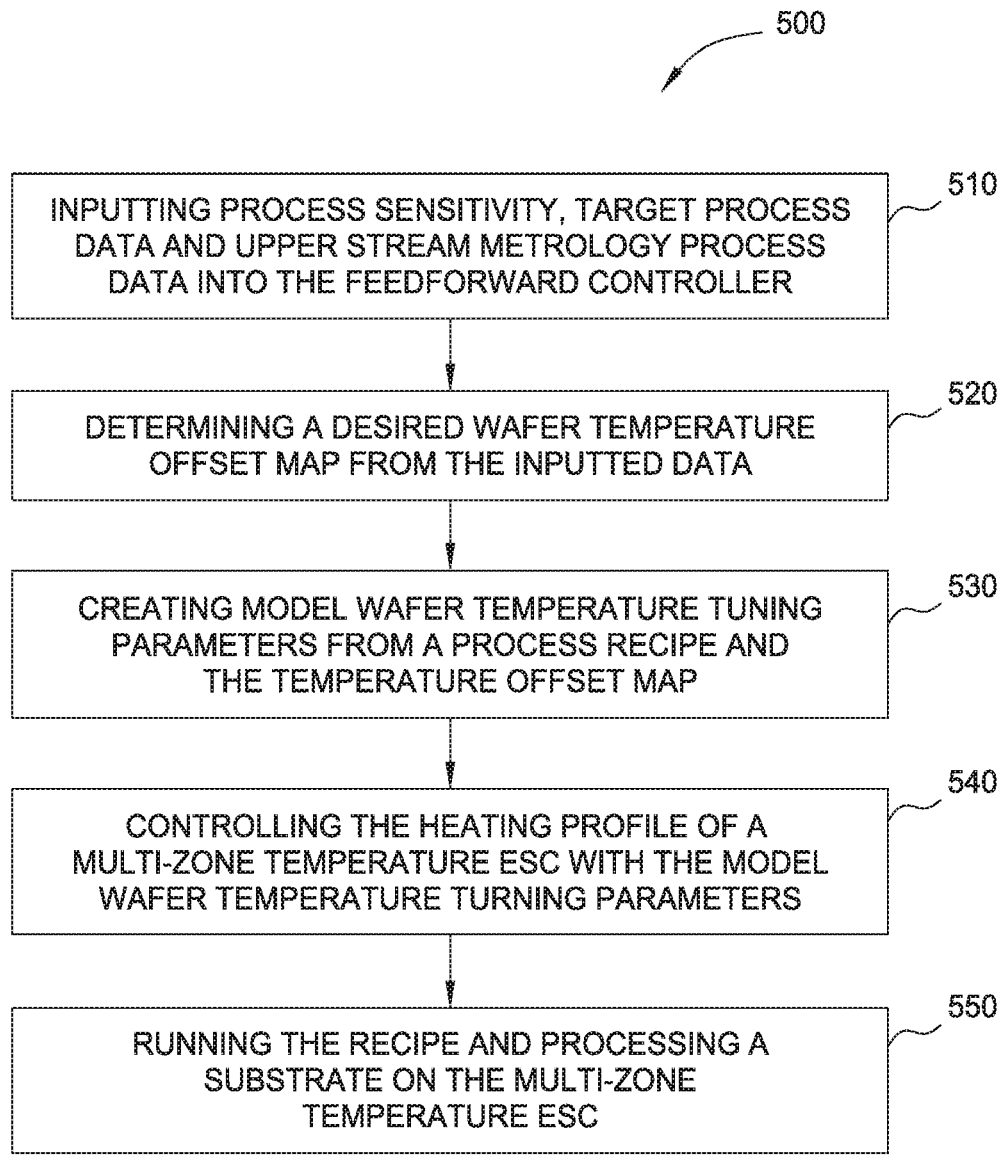
FIG. 5 is a flow diagram for determining a process recipe for the spatially tunable heaters according to one embodiment.

FIG. 5 is a flow diagram of a method 500 for processing a substrate using a process recipe according to a first embodiment, wherein the process recipe is determined using a feedforward controller routine. The flow diagram may be implemented as a software routine on a computing device, such as described by system 400. The spatially tunable heaters are independently controllable and determine a temperature profile of substrates processed thereon. The controller may alter the heat generated by one spatially tunable heater relative another by controlling at least one or more of the duty cycle, voltage, current, duration of power applied separately to each individual spatially tunable heater relative another. The power supplied to the spatially tunable heaters may also be provides simultaneously between a plurality of heaters as described above, or alternatively, sequentially scanned across individual spatially tunable heaters. A workpiece, such as the substrate 118, may be processed on the substrate support assembly. For example, the substrate may be processed in a vacuum chamber, for example using a plasma process. The vacuum process, which may be optionally performed in the presence of a plasma within the processing chamber, may be one of etching, chemical vapor deposition, physical vapor deposition, ion implantation, plasma treating, annealing, oxide removal, abatement or other plasma process. It is contemplated that the work-piece may be processed on the temperature controlled surface in other environments, for example, at atmospheric conditions, for other applications.

The method 500 begins at operation 510 by inputting one or more of process sensitivity, target process data and upstream metrology process data into the feedforward controller routine. The feedforward controller routine is set up that it takes the upstream metrology data, target process data and process sensitivity and directly outputs the desired wafer temp offset map. At operation 520, a desired wafer temperature offset map is determined from the inputted data.

At operation 530, model wafer temperature tuning parameters are created from a process recipe and the temperature offset map. The temperature offset map is feedback to the temp tuner based on the feedforward of wafer temp and process recipe.

At operation 540, the heating profile of the multi-zone temperature ESC is controlled using the model wafer temperature tuning parameters. The control for each spatially tunable heater can be performed simultaneous in the electrostatic chuck 210 allowing any selection of spatially tunable heaters to quickly generate a specific temperature profile. Control of the power provided to the individual spatially tunable heaters may be provide through an external controller interfacing over an optical connection to the tuning heater controller disposed in the substrate support assembly. Additionally, the tuning heater controller may simultaneously provide power to one spatially tunable heater while cycling another spatially tunable heater and cycling still other spatially tunable heaters at different overlapping time intervals. In this manner, the spatially controllable heaters may have a temperature profile across the substrate support made to match the model wafer temperature tuning parameters.

The model based wafer temp tuner then outputs the desired process parameter to form a new recipe. At operation 550, the recipe is run and the substrate is processed on the multi-zone temperature ESC.

Figure 6:
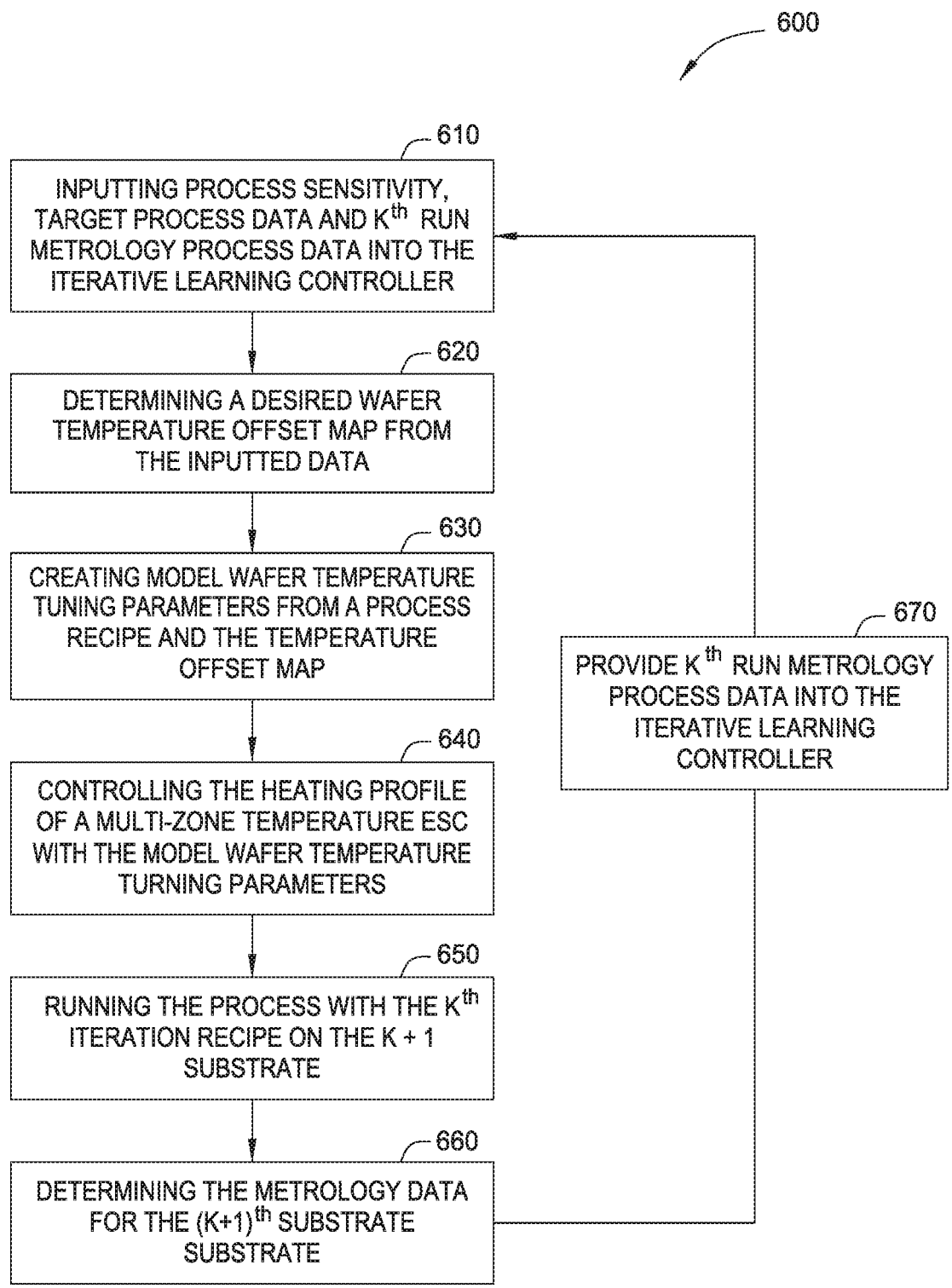
FIG. 6 is a flow diagram for determining a process recipe for the spatially tunable heaters according to another embodiment.

FIG. 6 is a second embodiment of a method 600 for processing a substrate using the spatially tunable heaters in conjunction a feedback controller routine. The process begins at operation 610 wherein the process sensitivity, target process data and $k^{th}$ run metrology process data are inputted into the iterative learning controller. At $k^{th}$ iteration (wherein k=1, 2, . . . ), a feedback controller routine is set up to have the inputs of the delta metrology data, i.e., the $k^{th}$ run metrology data, target process data, is applied to obtain the desired substrate temperature profile based on process to temperature sensitivity and substrate temp data. The feedback controller routine may be an iterative learning controller or other type of controller such as a LUT, PID, MPC or other suitable controller.

At operation 620, a desired substrate temperature offset map is determined from the inputted data. The desired substrate temperature offset map becomes an input for the controller to adjust the recipe parameters such as directing the PWM controller to modify the output from the spatially tunable heaters so that the next substrate is run with a temperature profile as close as possible to that of the desired substrate temperature profile. The iteration is ongoing till desired process performance is achieved. The process may involve multiple iterations with multiple substrates.

At operation 630, a model substrate temperature tuning parameter may be created from a process recipe and the temperature offset map. The key recipe outputs, such as temperature, may be adjusted every time a new desired process target and process sensitivity changes.

At operation 640, the heating profile of a multi-zone and spatially tunable temperature electrostatic chuck may be controlled with the model substrate temperature tuning parameters. For example, the model substrate temperature tuning parameters may include a uniquely incremental increase in power to several individual spatially tunable heaters while additionally decreasing the power to other individual spatially tunable heaters to attain a correction to achieve a desired temperature profile.

At operation 650, the process is run with the K$^{th}$ iteration recipe on the K+1 substrate. That is, the process recipe is modified after measuring the substrate. The process recipe is then used for processing the next substrate. In some embodiments, the process recipe may be determined from measurements of a prior group of substrates. For example, the substrates may be placed in a FOUP and moved to a separate metrology device. The recipe may be determined from the last substrate processed in the FOUP. Alternatively, the controller may look at a trend of the metrology for the substrates in the FOUP and make adjustments to the current process recipe based on the trend.

At operation 660, the metrology data for the (K+1)$^{th}$ substrate is determined. The metrology data may be stored in a database, such as at the APC, for future use. At operation 670, the (K+1)$^{th}$ run metrology process data is provided to the iterative learning controller. The controller may adjust the current process recipe (K+2)$^{th}$ based on the metrology process data.

Figure 7:
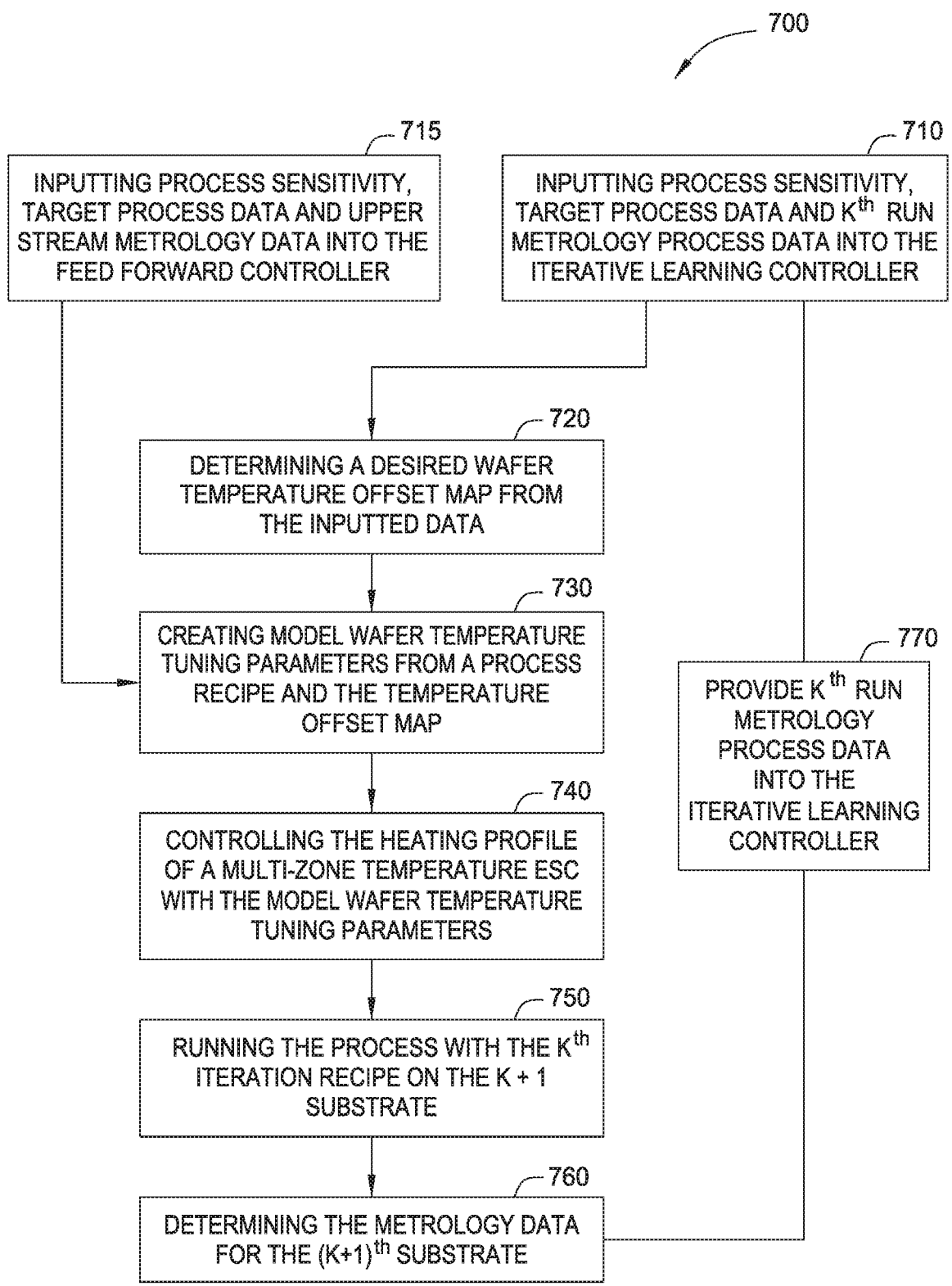
FIG. 7 is a flow diagram for determining a process recipe for the spatially tunable heaters according to yet another embodiment.

FIG. 7 is a flow diagram of a method 700 for processing a substrate, wherein a process recipe is determined for the spatially tunable heaters using a feedback and feedforward controller routine. The process recipe for a current substrate may be modified based on both the feedback current process data and feed-forward upper ream metrology data.

The method 700 begins at operation 710 wherein the process sensitivity, target process data and k$^{th}$ run metrology process data are inputted into the iterative learning controller, i.e., the feedback controller routine. At operation 715, the process sensitivity, target process data and upstream metrology data are inputted into the feedforward controller routine.

At operation 720, a desired substrate temperature offset map is created from the inputted data from the feed forward controller routine and the iterative learning controller routine. Thus, both current process data and upper ream metrology data are used.

At operation 730, model substrate temperature tuning parameters are created from a process recipe and the temperature offset map in addition to the desired temperature offset map. The model substrate tuning parameters are used to determine desired heat output for individual spatially tunable heaters for achieving the desired temperature profile for the substrate.

At operation 740, the heating profile of a multi-zone temperature electrostatic chuck is controlled using the model wafer temperature tuning parameters. The PWM controller adjusts the power to each individual spatially tunable heater for achieving the desired temperature profile. While the power to one spatially tunable heater is being adjusted, the other spatially tunable heaters may be turned off or held at a given output. Alternatively, the power to a plurality, such as two, more or all, of the spatially tunable heater may be adjusted simultaneously. There may be 140 or more spatially tunable heaters with each spatially tunable heater being individually controlled for obtaining customizable heat output. The controller may indicate to the PWM controller to provided 20 percent power to one spatially tunable heater, e.g. spatially tunable heater$_x$, to achieve about a 1 degree Celsius temperature increase in a first location adjacent that heater. The controller may simultaneously instructing the PWM to provide 80 percent power to a second spatially tunable heater, e.g. spatially tunable heater$_y$, to achieve about a 4 degree Celsius increase in a second location adjacent that heater. In this manner, up to 100 percent of the spatially tunable heaters may be individually controlled simultaneously for creating a unique temperature profile.

At operation 750, the process with the K$^{th}$ iteration recipe is run on the K+1 substrate. Thus, the recipe may be tuned for each subsequent substrate to uniquely tailor the temperature profile to achieve a desired result.

At operation 760, the metrology data for the (K+1)$^{th}$ substrate is determined. At operation 770, the (K+1)$^{th}$ run metrology process data is provided into the iterative learning controller routine for use in determining the substrate temperature offset map for the (K+2)$^{th}$ substrate.

Advantageously, the process tuning can control the critical dimension uniformity, incoming critical dimension compensation, and etch rate. The spatially tunable heaters maintain consistent substrate temperature in various chamber environments from one ESC to another ESC. The spatially tunable heaters may be used to promote edge zone temperature control configured to minimize process kit erosion or compensate edge process drift and increase mean time between cleaning. The spatially tunable heaters may have non-uniform shape to correct inherent non-uniformity of the processing chamber. Additionally, the spatially tunable heaters are used as a probe for temperature or heat flux measurement. Thus, the spatially tunable heaters tune the process results to compensate for variation over time.

While the foregoing is directed to implementations of the present invention, other and further implementations of the invention may be devised without departing from the basic scope thereof, and the scope thereof is determined by the claims that follow.

We claim:

1. A method of processing substrates on a substrate support assembly, the method comprising:
   processing a first substrate using a first temperature profile on a substrate support assembly having primary heaters and spatially tunable heaters, the spatially tunable heaters vertically overlapped with the primary heaters and the first substrate;
   determining a deviation profile from a result of processing the first substrate, wherein determining the deviation profile comprises:
   inputting data including at least one or more of process sensitivity, target process data and upstream metrology process data into a feedforward controller routine;
   determining a desired substrate temperature offset map from the inputted data; and
   creating the deviation profile from a process recipe and the substrate temperature offset map;
   controlling each spatially tunable heater independently of the primary heaters and each other spatially tunable heater in response to the deviation profile to enable discrete lateral and azimuthal tuning of local temperature of the substrate support assembly in forming a second temperature profile; and
   processing a second substrate with the second temperature profile.

2. The method of claim 1, wherein determining the deviation profile comprises:
   provide a first run metrology process data into an iterative learning controller routine;
   inputting data including at least one or more of process sensitivity, target process data and the first run metrology process data into the iterative learning controller routine;
   determining a desired wafer temperature offset map from the inputted data; and
   creating the deviation profile from a process recipe and the temperature offset map.

3. The method of claim 1, wherein determining the deviation profile comprises:
 providing $K^{th}$ run metrology process data into an iterative learning controller routine;
 inputting processing data comprising at least one or more of process sensitivity, target process data and $K^{th}$ run metrology process data into the iterative learning controller routine;
 determining a desired wafer temperature offset map from the inputted data;
 inputting process sensitivity, target process data and upstream metrology data into a feedforward controller routine; and
 creating the deviation profile from a process recipe and the temperature offset map.

4. The method of claim 1, wherein forming the second temperature profile of the substrate support assembly further comprises:
 applying more or less power to at least some of the spatially tunable heaters at a plurality of discreet locations distributed across a work-piece support surface of the substrate support assembly relative to power applied to the spatially tunable heaters not at the plurality of discreet locations while processing the first substrate.

5. The method of claim 1, wherein the spatially tunable heaters are simultaneously powered, and wherein at least two of the spatially tunable heaters have different percent power outputs.

6. The method of claim 1, further comprising:
 increasing a work-piece support surface of the substrate support assembly about 5 degree Celsius at a location corresponding to a spatially tunable heater having a power output of about 100%.

7. A computer-readable storage medium storing a program, which, when executed by a processor performs an operation for processing substrates on a substrate support assembly, the operation comprising:
 processing a first substrate using a first temperature profile on a substrate support surface of a substrate support assembly having primary heaters and spatially tunable heaters, the spatially tunable heaters vertically overlapped with the primary heaters and the substrate support surface;
 determining a deviation profile from a result of processing the first substrate, wherein determining the deviation profile comprises:
  inputting data including at least one or more of process sensitivity, target process data and upstream metrology process data into a feedforward controller routine;
  determining a desired substrate temperature offset map from the inputted data; and
  creating the deviation profile from a process recipe and the substrate temperature offset map;
 controlling each spatially tunable heater independently of the primary heaters and each other spatially tunable heater in response to the deviation profile to enable discrete lateral and azimuthal tuning of local temperature of the substrate support assembly in forming a second temperature profile; and
 processing a second substrate with the second temperature profile.

8. The computer-readable storage medium storing the program of claim 7, wherein determining the deviation profile comprises:
 provide a first run metrology process data into an iterative learning controller routine;
 inputting data including at least one or more of process sensitivity, target process data and the first run metrology process data into the iterative learning controller routine;
 determining a desired wafer temperature offset map from the inputted data; and
 creating the deviation profile from a process recipe and the temperature offset map.

9. The computer-readable storage medium storing the program of claim 7 wherein determining the deviation profile comprises:
 providing $K^{th}$ run metrology process data into an iterative learning controller routine;
 inputting processing data comprising at least one or more of process sensitivity, target process data and $K^{th}$ run metrology process data into the iterative learning controller routine;
 determining a desired wafer temperature offset map from the inputted data;
 inputting process sensitivity, target process data and upstream metrology data into a feedforward controller routine; and
 creating the deviation profile from a process recipe and the temperature offset map.

10. The computer-readable storage medium storing the program of claim 7, wherein forming the second temperature profile of the substrate support assembly further comprises:
 applying more or less power to at least some of the spatially tunable heaters at a plurality of discreet locations distributed across a work-piece support surface of the substrate support assembly relative to power applied to the spatially tunable heaters not at the plurality of discreet locations while processing the first substrate.

11. The computer-readable storage medium storing the program of claim 7, wherein the spatially tunable heaters are simultaneously powered, and wherein at least two of the spatially tunable heaters have different percent power outputs.

12. The computer-readable storage medium storing the program of claim 7, further comprising:
 increasing a work-piece support surface of the substrate support assembly about 5 degree Celsius at a location corresponding to a spatially tunable heater having a power output of about 100%.

13. A system, comprising:
 a processor; and
 a memory, wherein the memory includes an application program configured to perform an operation for processing substrates on a substrate support assembly, comprising:
  processing a first substrate using a first temperature profile on a substrate support surface of a substrate support assembly having primary heaters and spatially tunable heaters, the spatially tunable heaters vertically overlapped with the primary heaters and the substrate support surface;
  determining a deviation profile from a result of processing the first substrate, wherein determining the deviation profile comprises:
   inputting data including at least one or more of process sensitivity, target process data and upstream metrology process data into a feedforward controller routine;

determining a desired substrate temperature offset map from the inputted data; and creating the deviation profile from a process recipe and the substrate temperature offset map;

controlling each spatially tunable heater independently of the primary heaters and each other spatially tunable heater in response to the deviation profile to enable discrete lateral and azimuthal tuning of local temperature of the substrate support assembly in forming a second temperature profile; and processing a second substrate with the second temperature profile.

14. The system of claim 13, wherein determining the deviation profile comprises:

provide a first run metrology process data into an iterative learning controller routine;

inputting data including at least one or more of process sensitivity, target process data and the first run metrology process data into the iterative learning controller routine;

determining a desired wafer temperature offset map from the inputted data; and creating the deviation profile from a process recipe and the temperature offset map.

15. The system of claim 13, wherein determining the deviation profile comprises:

providing $K^{th}$ run metrology process data into an iterative learning controller routine;

inputting processing data comprising at least one or more of process sensitivity, target process data and $K^{th}$ run metrology process data into the iterative learning controller routine;

determining a desired wafer temperature offset map from the inputted data;

inputting process sensitivity, target process data and upstream metrology data into a feedforward controller routine; and creating the deviation profile from a process recipe and the temperature offset map.

16. The system of claim 13, further comprising:

increasing a work-piece support surface of the substrate support assembly about 5 degree Celsius at a location corresponding to a spatially tunable heater having a power output of about 100%.

17. The system of claim 13, wherein the spatially tunable heaters are simultaneously powered, and wherein at least two of the spatially tunable heaters have different percent power outputs.

* * * * *